United States Patent [19]

Jang

[11] Patent Number: 5,643,810
[45] Date of Patent: Jul. 1, 1997

[54] METHODS OF FORMING BiCMOS SEMICONDUCTOR DEVICES

[75] Inventor: Young-Soo Jang, Kyungki-do, Rep. of Korea

[73] Assignee: Samsung Electronics Co., Ltd., Suwon, Rep. of Korea

[21] Appl. No.: 688,998

[22] Filed: Aug. 1, 1996

[30] Foreign Application Priority Data

Oct. 6, 1995 [KR] Rep. of Korea .................... 95-34194

[51] Int. Cl.$^6$ .................................................. H01L 21/265
[52] U.S. Cl. .................. 437/31; 437/34; 437/43; 437/59; 437/162; 148/DIG. 9
[58] Field of Search ............................ 437/31, 34, 43, 437/59, 162; 148/DIG. 9

[56] References Cited

U.S. PATENT DOCUMENTS

| | | | |
|---|---|---|---|
| 4,963,502 | 10/1990 | Teng et al. | 437/41 |
| 5,006,476 | 4/1991 | De Jong et al. | 437/31 |
| 5,348,896 | 9/1994 | Tang et al. | 437/59 |
| 5,407,847 | 4/1995 | Hayden et al. | 437/162 |

*Primary Examiner*—Tuan H. Nguyen
*Attorney, Agent, or Firm*—Bell, Seltzer, Park & Gibson

[57] ABSTRACT

Methods of forming BiCMOS semiconductor devices include steps for forming bird's beak shaped oxide extensions between the gate electrodes and drain and source regions of CMOS devices to inhibit drain leakage currents and reduce gate-to-drain capacitance. These methods also include steps for forming bird's beak shaped oxide extensions at the emitter-base junctions of BJTs to reduce hot carrier induced P-N junction breakdown. A preferred method includes the steps of forming a gate electrode of a field effect transistor on a face of a semiconductor substrate and then forming self-aligned source and drain regions in the substrate using the gate electrode as a mask. A first conductive layer is then formed on the source and drain regions and used to diffuse dopants into the source and drain regions to increase the conductivity therein. Simultaneously with this diffusion step, the ends of the gate electrode and the first conductive layer are oxidized to form first bird's beak shaped oxide extensions between the gate electrode and the source and drain regions. These first bird's beak shaped oxide extensions are preferably formed to reduce drain leakage currents and gate-to-source capacitance by, among other things, reducing the electric field between the drain-side end of the gate electrode and the drain region. The first conductive layer can also be etched back into discrete intermediate source and drain contact regions to facilitate the subsequent formation of source and drain electrodes in electrical contact with the source and drain regions. Similar steps can also be performed to simultaneously form bipolar junction transistors adjacent the field effect transistors.

20 Claims, 4 Drawing Sheets

METHODS OF FORMING BICMOS SEMICONDUCTOR DEVICES

FIELD OF THE INVENTION

The present invention relates to semiconductor device fabrication methods, and more particularly to methods of forming bipolar junction transistors and field effect transistors.

BACKGROUND OF THE INVENTION

The electrical characteristics of field effect transistors having submicron gate lengths can be degraded by field induced hot carrier injection parasitics and potentially high leakage currents. To inhibit these parasitic effects, field effect transistors have been formed with lightly doped drain (LDD) region extensions. However, conventional lightly doped drain region extensions typically increase the parasitic gate-to-drain capacitance and contribute to an increase in gate induced leakage currents at the drain. In addition, bipolar junction transistors having reduced dimensions can suffer from premature electrical field-induced breakdown at the emitter-base P-N junction when this junction is heavily reverse biased. Accordingly, when conventional steps for forming field effect transistors and bipolar junction transistors are merged into BiCMOS fabrication methods, the above described problems are compounded.

SUMMARY OF THE INVENTION

It is therefore an object of the present invention to provide improved methods of forming semiconductor devices such as bipolar junction transistors and field effect transistors.

It is another object of the present invention to provide methods of forming highly integrated circuits containing field effect transistors and bipolar junction transistors integrated in a common semiconductor substrate.

It is still another object of the present invention to provide methods of forming BiCMOS devices having reduced parasitic capacitances, lateral dimensions, susceptibility to breakdown and leakage currents.

These and other objects, features and advantages of the present invention are provided by methods which allow for simultaneous formation of complementary metal-oxide-semiconductor transistors (CMOS) and bipolar junction transistors (BJT) on a semiconductor substrate, and provide self-aligned contacts, inhibit drain leakage currents and gate-to-drain parasitic capacitances in CMOS devices and inhibit hot carrier breakdown at the emitter-base junctions in BJT devices. In particular, the preferred methods include steps for forming bird's beak shaped oxide extensions between the gate electrodes and drain and source regions of CMOS devices to inhibit drain leakage currents and reduce gate-to-drain capacitance. These methods also include steps for forming bird's beak shaped oxide extensions at the emitter-base junctions of BJTs to reduce hot carrier induced P-N junction breakdown.

According to one embodiment of the present invention, a method is provided which includes the steps of forming a gate electrode of a field effect transistor on a face of a semiconductor substrate containing a region of first conductivity type therein (e.g., P-type well) and then forming self-aligned source and drain regions of second conductivity type (e.g., N-type) in the first conductivity type region by implanting ions of second conductivity type therein using the gate electrode as a mask. A first conductive layer (e.g., polycrystalline silicon) containing second conductivity type dopants therein is then preferably formed on the source and drain regions. Then, the second conductivity type dopants in the first conductive layer are diffused into the source and drain regions to increase the conductivity therein while the ends of the gate electrode and the first conductive layer are simultaneously oxidized to form first bird's beak shaped oxide extensions between the gate electrode and the source and drain regions. In particular, these first bird's beak shaped oxide extensions reduce drain leakage currents and gate-to-source capacitance by, among other things, increasing the distance and thereby reducing the electric field between the drain-side end of the gate electrode and the drain region, including any lightly doped drain extension region (LDD region). The first conductive layer can also be etched back into discrete intermediate source and drain contact regions to facilitate the subsequent formation of source and drain electrodes in electrical contact with the source and drain regions.

A sacrificial gate electrode is also preferably patterned to facilitate formation of a bipolar junction transistor in a common substrate with the above described field effect transistor. In particular, an intrinsic base region of first conductivity type (e.g., P-type) is formed in the substrate and then during formation of the gate electrode of the field effect transistor, a sacrificial gate electrode is formed on the intrinsic base region. Then, during formation of the first conductive layer, a second conductive layer of first conductivity type is formed on the intrinsic base region, using the sacrificial gate electrode as a mask. During the above described diffusing step, first conductivity type dopants are also diffused from the second conductive layer into the intrinsic base region to form a more highly doped extrinsic base region, which is self-aligned to the sacrificial gate electrode. Opposing ends of the sacrificial gate electrode, the second conductive layer and a surface portion of the intrinsic base region are also simultaneously oxidized to form second bird's beak shaped oxide extensions between the sacrificial gate electrode and the extrinsic base region. The sacrificial gate electrode is then replaced with an intermediate emitter contact region of second conductivity type. This intermediate emitter contact region is then used as a supply of second conductivity type dopants which are preferably diffused into the intrinsic base region to form a P-N junction containing an emitter region of second conductivity type and the intrinsic base region of first conductivity type. During this diffusion step, the second bird's beak shaped oxide extensions are used to define the lateral dimensions of the emitter region. Preferably, the second bird's beak shaped oxide extensions facilitate formation of a slight second conductivity type inversion layer (e.g., N-) in a portion of the intrinsic base region extending adjacent the P-N junction whenever the emitter-base junction is supporting a large reverse bias. As will be understood by those skilled in the art, the formation of a slight inversion layer in the intrinsic base region improves the breakdown characteristics of the emitter-base junction by reducing hot carrier injection.

Accordingly, the preferred embodiment provides an improved method of forming field effect transistors and bipolar junction transistors, which can be used in CMOS, BJT and BiCMOS applications.

DESCRIPTION OF PREFERRED EMBODIMENTS

Figure 1A:
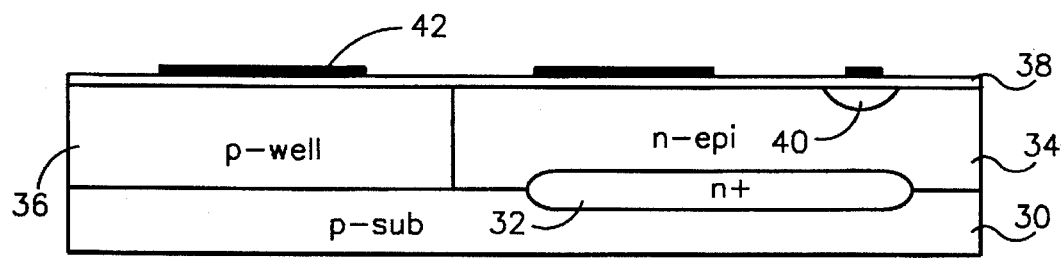
FIGS. 1A–1K illustrate schematic cross-sectional views of intermediate structures illustrating a method of forming BiCMOS devices according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well.

Referring now to FIGS. 1A–1K and 2, preferred methods of forming BiCMOS devices according to the present invention will be described. In particular, FIG. 1A illustrates steps of forming a semiconductor substrate which can used to form both CMOS field effect transistors and bipolar junction transistors therein, at adjacent locations. In particular, a preliminary substrate 30 of first conductivity type (shown as P-type) is first provided and then formation of a buried collector region 32 (shown as N-type) is initiated by implanting second conductivity type dopants into a face of the preliminary substrate 30, using a mask (not shown) to define the lateral extent of the buried collector region 32. Next, a relatively lightly doped layer 34 of second conductivity type (i.e., "N-epi") is formed on the face of the preliminary substrate using conventional epitaxial growth techniques, for example. As will be understood by those skilled in the art, during the step of forming the relatively lightly doped layer 34, diffusion of the implanted dopants in the buried collector region 32 takes place and causes an increase in the vertical and lateral dimensions of the buried collector region 32. A well region 36 of first conductivity type (i.e., "P-well") is also preferably formed in the relatively lightly doped region 34 using conventional techniques. As illustrated, the well region 36 extends to the preliminary substrate 30 and forms a non-rectifying junction therewith.

In accordance with the above steps, the preliminary substrate 30 is preferably formed to have a resistivity in a range between about 10 and 30 Ω-cm, at a <111> or <100> crystal direction. The buried collector region 32 is also preferably formed to have a sheet resistance in a range between about 10 to 30 Ω/□ and the relatively lightly doped region 34 can be formed to have a resistivity in a range between about 0.3 to 1.0 Ω-cm and a thickness of about 0.8 to 2.0 μm. Referring still to FIG. 1A, a pad oxide layer 38 having a thickness in a range between about 300 to 600 Å is preferably formed on a face of a substrate containing the relatively lightly doped region 34 and well region 36 therein. A shallow collector contact region 40 can also be initiated by implanting second conductivity type dopants (e.g., N-type) into the face of the substrate, using a photolithographically patterned implant mask (not shown). In particular, phosphorus ions can be implanted at a dose level in a range between about $3 \times 10^{15}$ to $8 \times 10^{15}$ ions/cm$^2$ and at an implant energy in a range between about 30 and 80 KeV, to form the shallow collector contact region 40. A layer of silicon nitride can then be patterned on the pad oxide layer and used as a mask 42 to define active and inactive regions within the substrate.

Figure 1B:
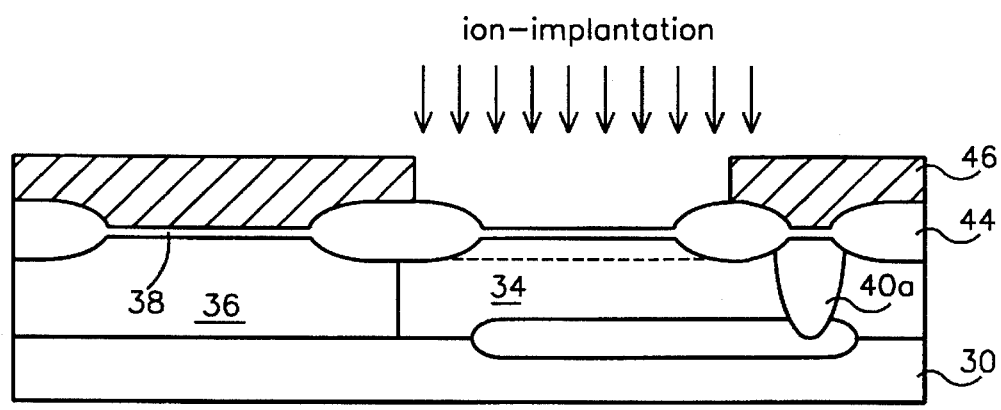

For example, referring now to FIG. 1B, the patterned silicon nitride layer 42 can be used as a mask during the formation of field oxide isolation regions 44 having thicknesses in a range between about 4000 to 7000 Å, using conventional techniques such as local oxidation of silicon (LOCOS). During this step of forming field oxide isolation regions 44, the second conductivity type dopants in the shallow collector contact region 40 diffuse downward and make contact with the buried collector region 32 to form a deep collector contact region 40a, as illustrated. After the field oxide isolation regions 44 have been formed over the inactive regions of the substrate, a photosensitive polymer film can also be formed and patterned to define a base implant mask 46 to first conductivity type dopants (e.g. P-type). As illustrated by the dotted lines in FIG. 1B, these first conductivity type dopants are preferably implanted to initiate formation of an intrinsic base region 48. Here, boron ions can be implanted at a dose level of between about $2 \times 10^{13}$ and $6 \times 10^{13}$ ions/cm$^2$ and at an energy level of about 15 to 30 KeV to form the intrinsic base region 48.

Figure 1C:
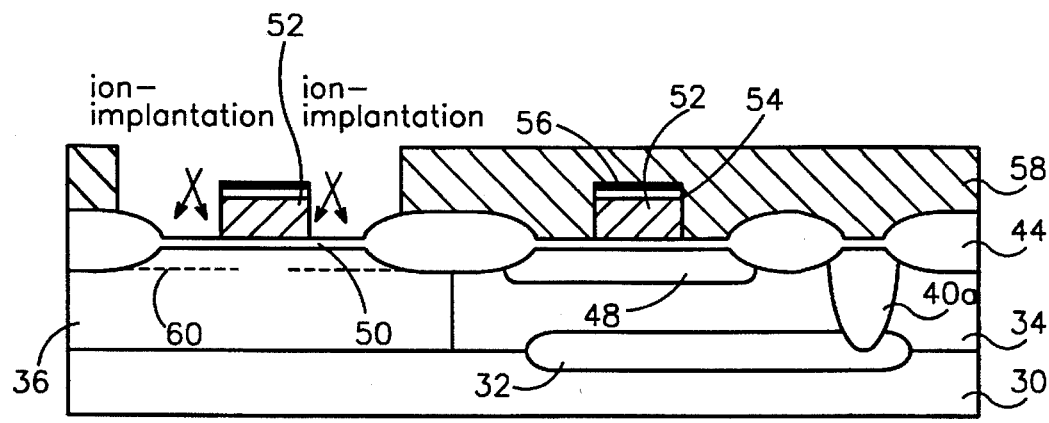

Referring now to FIG. 1C, the base implant mask 46 is removed and then the active regions of the substrate are exposed and cleaned by removing the pad oxide layer 38. A gate oxide insulating layer 50 having a thickness between about 70 and 200 Å is then thermally grown on the active regions. Using conventional techniques, a gate electrode 52 and sacrificial gate electrode 52 are then formed on the gate oxide insulating layer 50, opposite the well region 36 and intrinsic base region 48, respectively. An oxide cap 54 and silicon nitride cap 56 are also formed on the gate electrodes 52. As will be understood by those skilled in the art, the gate electrodes 52 and respective oxide and nitride caps 54, 56 can be formed by depositing layers of polycrystalline silicon, silicon dioxide and silicon nitride in sequence and then patterning these layers using conventional photolithographically defined etching techniques. In particular, a polycrystalline silicon layer having a thickness of about 1000 to 3000 Å is deposited as a blanket layer and then made highly conductive by implanting dopants of second conductivity type (e.g., phosphorus) into the blanket layer. Thereafter, a thin oxide layer 54 having a thickness in a range between about 70 and 150 Å and a nitride layer having a thickness in a range between about 500 to 1500 Å are formed on the polycrystalline silicon layer. The etching step is then performed to define the gate electrode 52 and sacrificial gate electrode 52 with the oxide and nitride caps 54, 56, thereon.

Still referring to FIG. 1C, a photosensitive polymer film is then applied onto the gate electrodes 52 and field oxide isolation regions 44. The film is then exposed and patterned to form a mask 58 for a large-tilt-angle ion implantation step. Here, second conductivity type dopants are implanted into the well region 36 to define relatively lightly doped source and drain implant regions 60 which extend laterally underneath the gate electrode 52, as illustrated by the dotted lines. This ion implantation step may be performed by implanting phosphorus ions at a dose level in a range between about $1 \times 10^{12}$ to $1 \times 10^{13}$ ions/cm$^2$ and at an implant energy in a range between about 60 to 100 KeV.

Figure 1D:
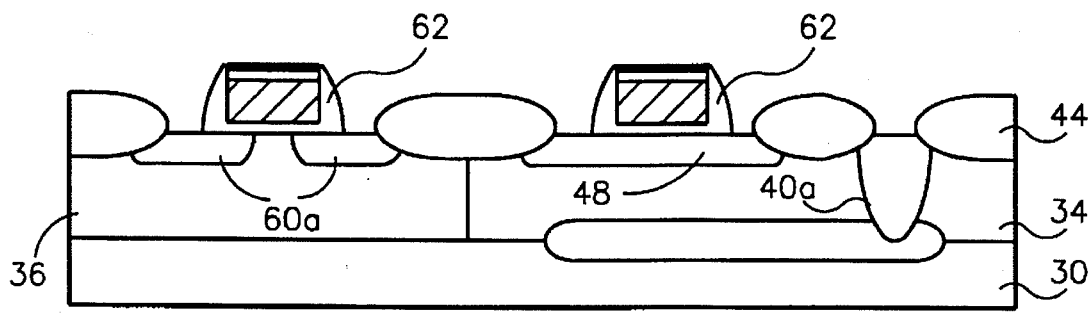

Referring now to FIG. 1D, the patterned mask 58 is then removed and then an oxide layer (not shown) having a thickness in a range between about 1000 to 3000 Å is formed on the exposed surface. The oxide layer is then subjected to reactive ion etching (RIE) to form sidewall oxide spacers 62 on opposing ends of the gate electrode 52 and sacrificial gate electrode 52, as illustrated, to form electrically insulated electrodes. As will be understood by those skilled in the art, during the step of forming the oxide layer and spacers 62 therefrom, the implanted phosphorus ions are further diffused into the substrate and underneath the gate electrode 52 to define preliminary source and drain regions 60a which are relatively lightly doped. During the oxide layer forming step, the implanted boron ions in the intrinsic base region 48 are also further diffused into the relatively lightly doped region 34.

Figure 1E:
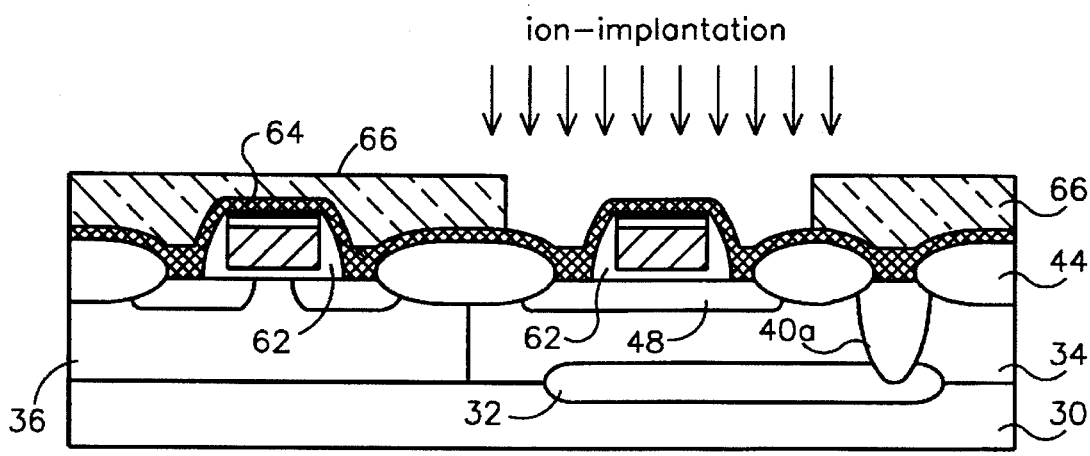
Figure 1F:
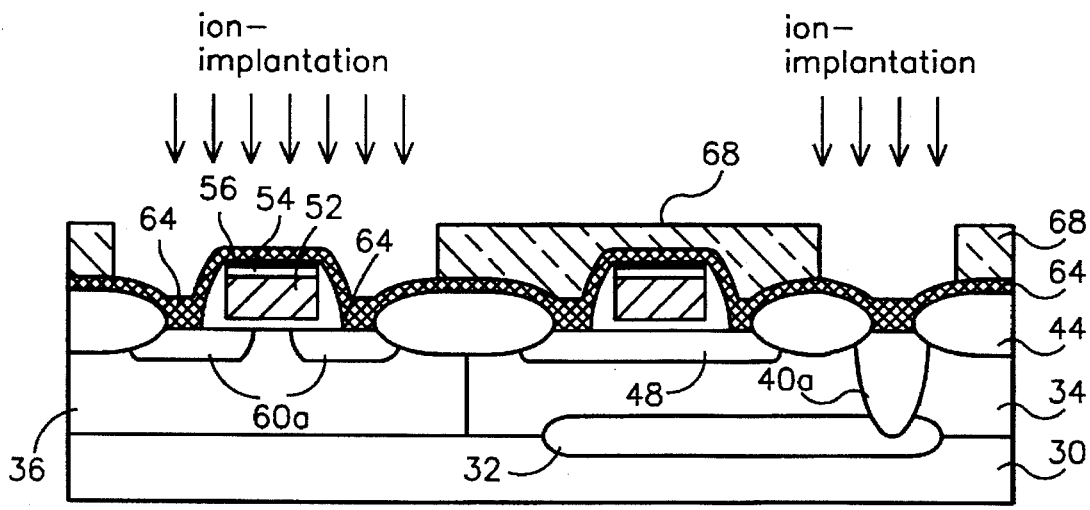

Referring now to FIG. 1E, a blanket layer 64 of polycrystalline silicon having a thickness in the range between about 3000 to 6000 Å is then applied to the substrate. A photosensitive polymer film is then applied onto the blanket layer and patterned to form an extrinsic base region implant mask 66. In particular, dopants of first conductivity type (e.g., boron ions) are preferably implanted into the exposed portions of the blanket polycrystalline silicon layer 64 at a dose level of about $2 \times 10^{14}$ to $5 \times 10^{15}$ ions/cm$^2$ and an energy level of about 30 to 60 KeV. As described more fully hereinbelow, these dopants render the exposed portion of the blanket layer 64 highly conductive. The extrinsic base region implant mask 66 is then removed and followed by the step of applying another photosensitive polymer film which is patterned to form a source/drain and collector region implant mask 68, as illustrated by FIG. 1F. Here, dopants of second conductivity type (e.g., arsenic ions) are preferably implanted into the exposed portions of the blanket polycrystalline silicon layer 64 at a dose level of about $3 \times 10^{15}$ to $1 \times 10^{16}$ ions/cm$^2$ and an energy level of about 40 to 80 KeV.

Figure 1G:
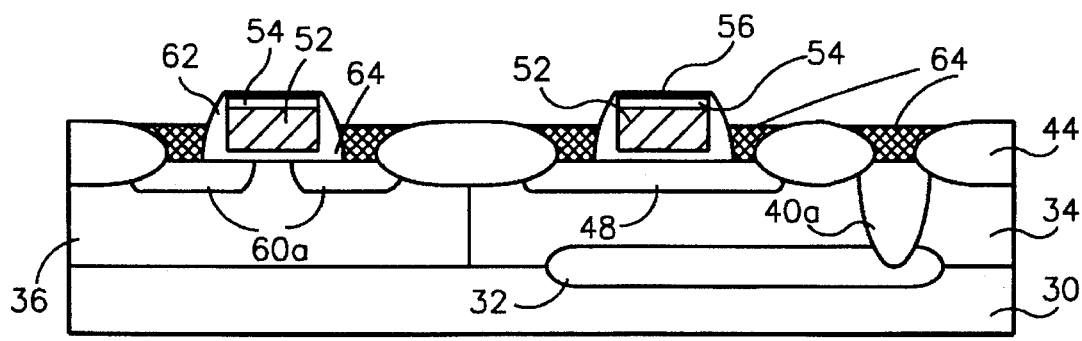
Figure 1H:
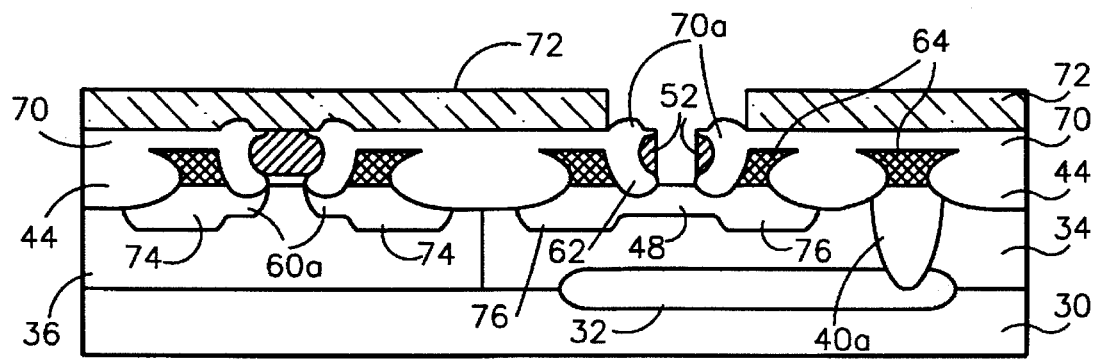

Then, as illustrated by FIG. 1G, the implant mask 68 is removed and followed by the step of etching back the blanket polycrystalline silicon layer 64 to define intermediate source and drain contact regions of second conductivity type on the relatively lightly doped source and drain regions 60a, respectively, an intermediate extrinsic base contact region of first conductivity type on the intrinsic base region 48 and an intermediate collector contact region of second conductivity type on the deep collector contact region 40a. Then, the etched back polycrystalline silicon regions and polycrystalline silicon gate electrodes 52 are oxidized to form a protective oxide layer 70 having a thickness between about 3000 to 5000 Å and also form bird's beak shaped oxide regions 70a, as shown in FIG. 1H. During this step, second conductivity type dopants from the intermediate source and drain contact regions are diffused into the preliminary source and drain regions 60a to form more highly doped portions 74 therein and second conductivity type dopants are also diffused from the intermediate collector contact region into the deep collector contact region 40a. Thus, the relatively lightly doped source and drain regions 60a function as lightly doped drain (LDD) extensions and lightly doped source (LDS) extensions, as will be understood by those skilled in the art. According to a preferred feature of the present invention, the bird's beak shaped oxide regions 70a extending underneath the gate electrode 52 facilitate a reduction in drain leakage currents and gate-to-source capacitance by, among other things, increasing the distance between the drain-side end of the gate electrode and the drain region, including any lightly doped drain extension region (LDD region), and thereby reducing the electric field strength between the drain-side end of the gate electrode and then drain region.

Simultaneously with the oxidation step, first conductivity type dopants in the intermediate extrinsic base contact region also diffuse into the intrinsic base region 48 to form a deeper and relatively highly doped extrinsic base region 76. After the oxidation step, the oxide cap region 54 and silicon nitride cap region 56 are removed from the gate electrodes 52. A photosensitive polymer film is then patterned and used as a mask 72 to vertically remove a center portion of the sacrificial gate electrode extending between the upper bird's beak oxide extension, and also remove the underlying gate oxide insulating layer 50 to expose the intrinsic base region 48, using a conventional dry etching technique.

Figure 1I:
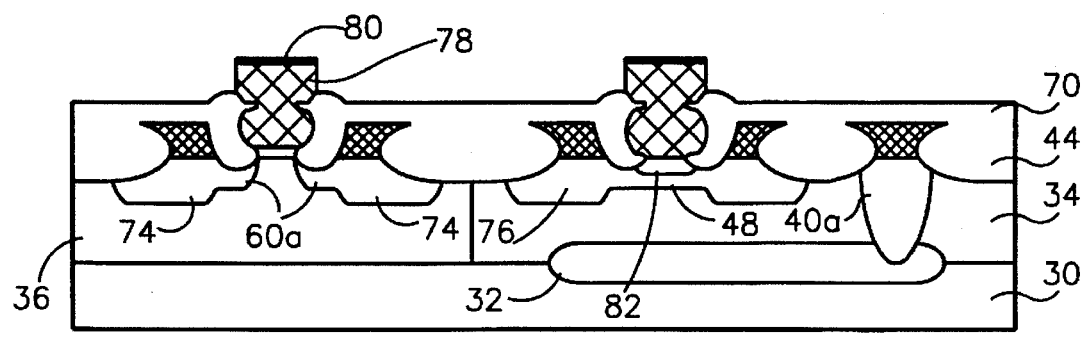

Referring now to FIG. 1I, the patterned mask 72 is then removed and followed by the step of depositing a polycrystalline silicon layer on the protective oxide layer 70 and then doping the polycrystalline silicon layer with second conductivity type dopants (e.g., arsenic) at an dose level in the range between about $4 \times 10^{15}$ to $1 \times 10^{16}$ ions/cm$^2$ and an energy in a range between about 40 to 80 KeV. The polycrystalline silicon layer may have a thickness in a range between about 2000 to 4000 Å. A tungsten silicide layer (WSi$_x$) is also formed on the polycrystalline silicon layer to a thickness in a range between about 150 to 600 Å. The tungsten silicide layer is then subjected to a sintering process at about 900° C. and then the sintered tungsten silicide layer and polycrystalline silicon layer are patterned to form a second conductivity type gate electrode 78 on the gate oxide insulating layer 50 and intermediate emitter contact region 78 in the opening defined during the dry etching step.

As will be understood by those skilled in the art, the sintering process also causes the diffusion of the second conductivity type dopants from the intermediate emitter contact region 78 into the exposed intrinsic base region 48 to form a second conductivity type emitter region 82. Here, however, the formation of a bird's beak shaped oxide region 70a between the intermediate emitter contact region 78 and portions of the intrinsic base region 48 extending adjacent the emitter-base P-N junction, facilitates formation of a slight second conductivity type inversion layer (e.g., N-) in the intrinsic base region 48 whenever the emitter-base junction is supporting a large reverse bias. This improves the breakdown characteristics of the emitter-base junction by reducing hot carrier injection.

Figure 1J:
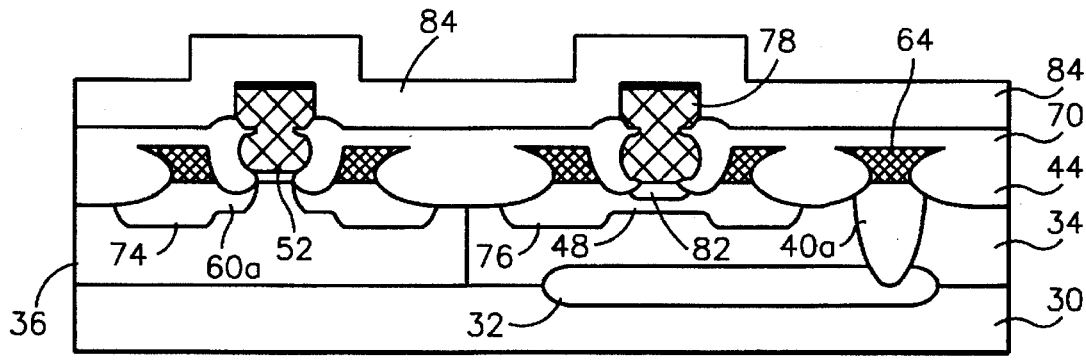
Figure 1K:
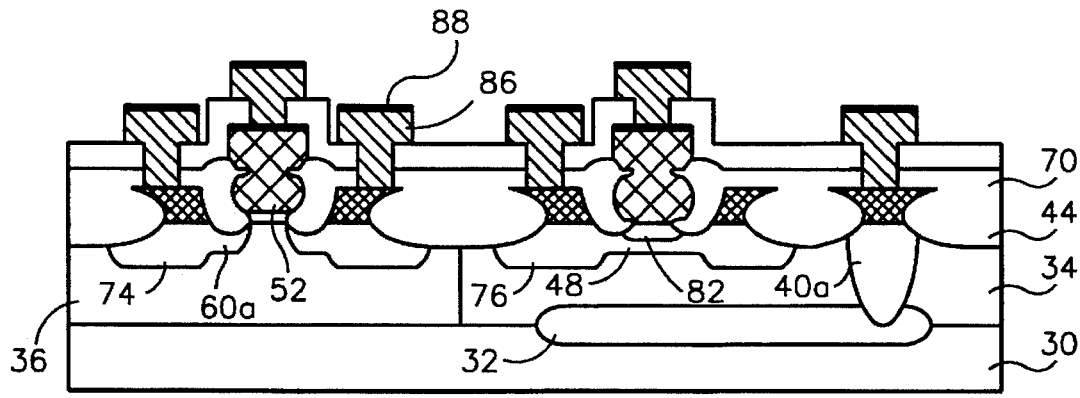
Figure 2:
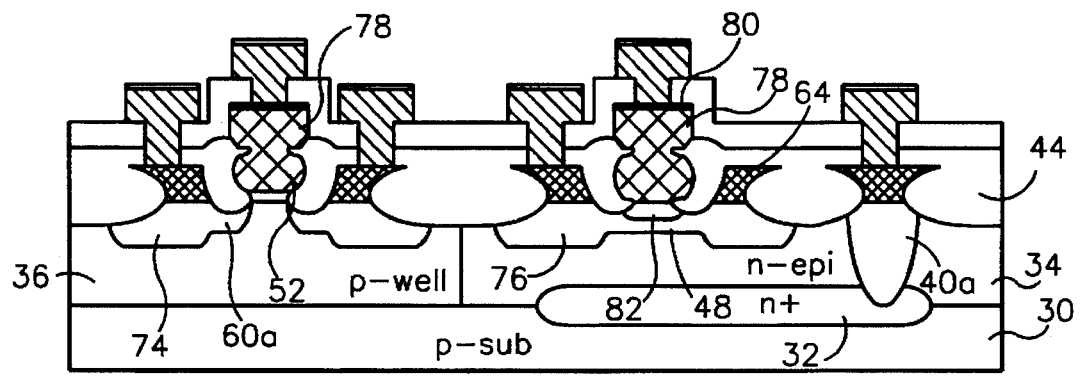
FIG. 2 illustrates a schematic cross-sectional view of a BiCMOS device according to the present invention.

Referring now to FIGS. 1J–1K and 2, a top oxide layer 84 having a thickness between about 2000 to 5000 Å is then formed using chemical vapor deposition (CVD) to electrically insulate the gate electrode and emitter contact. Then, the top oxide layer 84 is patterned to open windows therein which expose the intermediate source and drain contact regions, gate electrode, intermediate extrinsic base contact region, intermediate emitter contact region and intermediate collector contact region. Two layers of metallization 86, 88 are then applied to the top oxide layer and patterned to form source, gate, drain, extrinsic base, emitter and collector contacts, from left to right as illustrated by FIGS. 1K and 2.

Accordingly, the above described method allows for the simultaneous formation of complementary metal-oxide-semiconductor transistors (CMOS) and bipolar junction transistors (BJT) on a semiconductor substrate, and provides self-aligned contacts, inhibits drain leakage currents and gate-to-drain parasitic capacitances in CMOS devices and inhibits hot carrier breakdown at the emitter-base junctions in BJT devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor device, comprising the steps of:

forming a gate electrode on a face of a semiconductor substrate containing a region of first conductivity type therein;

forming source and drain regions of second conductivity type in the region of first conductivity type by implanting ions of second conductivity type into the face using the gate electrode as an implant mask;

forming a first conductive layer containing second conductivity type dopants therein, on the source and drain regions; and diffusing second conductivity type dopants from the first conductive layer into the source and drain regions to increase second conductivity type dopant concentrations therein, while simultaneously oxidizing the gate electrode at opposing ends thereof and the first conductive layer to form first bird's beak shaped oxide extensions between the gate electrode and the source and drain regions.

2. The method of claim 1, wherein said first conductive layer forming step comprises forming a polycrystalline silicon layer of second conductivity type on the source and drain regions.

3. The method of claim 2, wherein said diffusing step is preceded by the step of patterning the polycrystalline silicon layer into an intermediate source contact region on the source region and an intermediate drain contact region on the drain region.

4. The method of claim 3, wherein said diffusing step comprises diffusing dopants of second conductivity type from the intermediate source contact region into the source region and diffusing second conductivity type dopants from the intermediate drain contact region into the drain region.

5. The method of claim 4, further comprising the steps of forming an electrically insulating region on the intermediate drain contact region and intermediate source contact region; opening windows in the electrically insulating region to expose the intermediate drain contact region and intermediate source contact region; depositing drain metallization into one opening to ohmically contact the intermediate drain contact region; and depositing source metallization into another opening to ohmically contact the intermediate source contact region.

6. The method of claim 1, wherein said first conductive layer forming step is preceded by the step of forming sidewall spacers at the opposing ends of the gate electrode, while simultaneously diffusing the implanted ions of second conductivity type in the region of first conductivity type.

7. The method of claim 1, further comprising the steps of:

forming an intrinsic base region of first conductivity type in the semiconductor substrate, at the face;

forming a sacrificial gate electrode on the intrinsic base region;

forming a second conductive layer containing first conductivity type dopants therein on the intrinsic base region; and diffusing first conductivity type dopants from the second conductive layer into the intrinsic base region to form an extrinsic base region therein, while simultaneously oxidizing the sacrificial gate electrode at opposing ends thereof and portions of the second conductive layer and intrinsic base region to form second bird's beak shaped oxide extensions between the sacrificial gate electrode and the extrinsic base region.

8. The method of claim 7, wherein said first and second conductive layer forming steps comprise forming a polycrystalline silicon layer on the source, drain and intrinsic base regions; implanting first conductivity type dopants into a first portion of the polycrystalline silicon layer extending opposite the intrinsic base region; and implanting second conductivity type dopants into second portion of the polycrystalline silicon layer extending opposite the source and drain regions.

9. The method of claim 8, wherein said steps of diffusing second conductivity type dopants and diffusing first conductivity type dopants are performed simultaneously.

10. The method of claim 9, wherein said steps of diffusing second conductivity type dopants and diffusing first conductivity type dopants are preceded by the step of etching the polycrystalline silicon layer to form the first and second conductive layers.

11. The method of claim 7, further comprising the steps of forming an opening in the sacrificial gate electrode to expose the intrinsic base region; forming an intermediate emitter contact region of second conductivity type in the opening; and diffusing second conductivity type dopants from the intermediate emitter contact region into the intrinsic base region using the second bird's beak shaped oxide extensions as a diffusion mask.

12. A method of forming a BiCMOS semiconductor device, comprising the steps of:

forming a gate electrode on a face of a semiconductor substrate containing a region of first conductivity type therein and a region of second conductivity type therein, so that the gate electrode extends opposite the region of first conductivity type;

forming source and drain regions of second conductivity type in the region of first conductivity type by implanting ions of second conductivity type into the face using the gate electrode as an implant mask;

forming an intrinsic base region of first conductivity type in the region of second conductivity type by implanting ions of first conductivity type into the face;

forming a sacrificial gate electrode on the face of the semiconductor substrate, opposite the intrinsic base region;

forming a conductive layer containing first and second conductivity type dopants therein, on the source and drain regions and on the intrinsic base region;

patterning the conductive layer into an intermediate source contact region of second conductivity type on the source region, an intermediate drain contact region of second conductivity type on the drain region and an intermediate extrinsic base contact region of first conductivity type on the intrinsic base region; and simultaneously diffusing second conductivity type dopants from the intermediate source contact region into the source region, diffusing second conductivity type dopants from the intermediate drain contact region into the drain region and diffusing first conductivity type dopants from the intermediate extrinsic base contact region into the intrinsic base region.

13. The method of claim 12, wherein said steps of forming a gate electrode and sacrificial gate electrode are performed simultaneously.

14. The method of claim 13, wherein said conductive layer forming step comprises the steps of forming a polycrystalline silicon layer on the source, drain and intrinsic base regions; implanting first conductivity type dopants into a portion of the polycrystalline silicon layer contacting the intrinsic base region using a first implant mask; and implanting second conductivity type dopants into a portion of the polycrystalline silicon layer contacting the source and drain regions using a second implant mask.

15. The method of claim 14, wherein said diffusing step comprises oxidizing the gate electrode at opposing ends thereof, the intermediate source contact region and the intermediate drain contact regions simultaneously to form first bird's beak shaped oxide extensions between the gate electrode and the source and drain regions.

16. The method of claim 15, wherein said diffusing step comprises oxidizing the sacrificial gate electrode at opposing ends thereof and the intermediate extrinsic base contact region simultaneously to form second bird's beak shaped oxide extensions between the sacrificial gate electrode and the intrinsic base region.

17. The method of claim 12, wherein said diffusing step comprises oxidizing the gate electrode at opposing ends thereof, the intermediate source contact region and the intermediate drain contact regions simultaneously to form first bird's beak shaped oxide extensions between the gate electrode and the source and drain regions.

18. The method of claim 17, wherein said diffusing step comprises oxidizing the sacrificial gate electrode at opposing ends thereof and the intermediate extrinsic base contact region simultaneously to form second bird's beak shaped oxide extensions between the sacrificial gate electrode and the intrinsic base region.

19. The method of claim 16, further comprising the steps of forming an opening in the sacrificial gate electrode to expose the intrinsic base region; forming an intermediate emitter contact region of second conductivity type in the opening; and diffusing second conductivity type dopants from the intermediate emitter contact region into the intrinsic base region using the second bird's beak shaped oxide extensions as a diffusion mask.

20. The method of claim 18, further comprising the steps of forming an opening in the sacrificial gate electrode to expose the intrinsic base region; forming an intermediate emitter contact region of second conductivity type in the opening; and diffusing second conductivity type dopants from the intermediate emitter contact region into the intrinsic base region using the second bird's beak shaped oxide extensions as a diffusion mask.

* * * * *